United States Patent [19]

Sugiyama et al.

[11] Patent Number: 5,498,657

[45] Date of Patent: Mar. 12, 1996

[54] FLUORINE-CONTAINING POLYMER COMPOSITION

[75] Inventors: Norihide Sugiyama, Tokyo; Atsushi Watakabe; Shunsuke Yokotsuka, both of Yokohama; Atsuo Hiroi, Funabashi; Masaki Naritomi, Tokyo; Naoko Shirota, Yokohama; Ko Aosaki, Tokyo; Masaru Nakamura, Yokohama, all of Japan

[73] Assignees: Asahi Glass Company Ltd., Tokyo, Japan; Iwaki Glass Company Ltd., Funabashi, Japan

[21] Appl. No.: 296,469

[22] Filed: Aug. 26, 1994

[30] Foreign Application Priority Data

| Aug. 27, 1993 | [JP] | Japan | 5-235671 |
| Aug. 27, 1993 | [JP] | Japan | 5-235673 |
| Dec. 15, 1993 | [JP] | Japan | 5-315072 |
| Mar. 11, 1994 | [JP] | Japan | 6-041465 |
| Mar. 31, 1994 | [JP] | Japan | 6-063949 |
| Apr. 26, 1994 | [JP] | Japan | 6-088941 |

[51] Int. Cl.$^6$ ............... C08J 5/00; C08F 14/18; C08F 14/26; B32B 27/00

[52] U.S. Cl. .......... 524/463; 524/265; 524/462; 524/544; 526/245; 526/246; 526/247; 526/255; 428/421; 428/422

[58] Field of Search .......... 524/463, 265, 524/544; 428/421, 422; 526/245, 246, 255, 462

[56] References Cited

U.S. PATENT DOCUMENTS

| 4,348,310 | 9/1982 | Silva et al. | 524/544 |
| 5,021,527 | 6/1991 | Ohmori et al. | 524/544 |
| 5,031,641 | 7/1991 | Nanishi et al. | 524/544 |
| 5,290,846 | 3/1994 | Tuminello | 524/463 |
| 5,397,829 | 3/1995 | Morgan et al. | 524/463 |

*Primary Examiner*—Paul R. Michl
*Assistant Examiner*—Olga Asinovsky
*Attorney, Agent, or Firm*—Oblon, Spivak, McClelland, Maier & Neustadt

[57] ABSTRACT

A fluorine-containing polymer composition comprising a polymer having a functional group and a fluorine-containing aliphatic cyclic structure dissolved in a solvent mixture of an aprotic fluorine-containing solvent and a protic fluorine-containing solvent.

14 Claims, No Drawings

FLUORINE-CONTAINING POLYMER COMPOSITION

DETAILED DESCRIPTION OF THE INVENTION

1. Field of the Invention

The present invention relates to a fluorine-containing polymer composition suitable for coating, etc.

2. Prior Art

A polymer having a fluorine-containing aliphatic cyclic structure and a functional group such as a carboxyl group, a hydroxyl group, a silyl group, an amino group, a maleimide group or a nitrile group, has been proposed to improve the adhesion to various substrates or the heat resistance of the polymer having a fluorine-containing aliphatic cyclic structure (Japanese Unexamined Patent Publication No. 226177/1992 or No. 56936/1994).

However, such functional groups are usually introduced at the terminals of the polymer molecules or at the terminals of side chains of the polymer molecules and constitute associable groups in an aprotic fluorine-containing solvent, thus leading to a problem such that when the polymer having a fluorine-containing aliphatic ring structure and such a functional group, is dissolved in an aprotic fluorine-containing solvent, the viscosity of the solution tends to be remarkably high, and the solution undergoes gelletion to lose the fluidity. Therefore, filtration or coating of such a solution tends to be difficult.

A polymer having a functional group and a fluorine-containing aliphatic cyclic structure has excellent properties such as low permitivity, low water-absorptivity, heat resistance and chemical resistance, it is practically applied to a semiconductor element as e.g. an insulating material or a moisture proof coating. In such a case, a solution of the polymer having a functional group and a fluorine-containing aliphatic cyclic structure, is spin-coated on a wafer, and then the solvent is removed by evaporation to form a coating film, whereby smoothness of the coating film is questionable. Namely, there is a problem that due to the presence of associable groups in the evaporation process of the solvent, the surface of the coating film tends to be irregular and is likely to form a so-called orange peel surface.

PROBLEM TO BE SOLVING BY THE PRESENT INVENTION

The object of the present invention is to solve the above-mentioned drawbacks of the prior art.

MEANS FOR SOLVING THE PROBLEM

The present invention is a fluorine-containing polymer composition having a polymer having a functional group and a fluorine-containing aliphatic cyclic structure (hereinafter referred to simply as polymer A) dissolved in a solvent mixture of an aprotic fluorine-containing solvent and a protic fluorine-containing solvent.

In the present invention, an associable group is an atomic group consisting of at least two atoms and having a monovalent radical bond, and the interaction (attraction force) of such atomic groups is larger than their affinity to the aprotic fluorine-containing solvent, whereby a plurality of such atomic groups are likely to get together (associate). With a fluorine-containing polymer having such an associable group, a phenomenon such as gelletion or insolubilization is observed in an aprotic fluorine-containing solvent. Even if it is soluble, the viscosity tends to be high as compared with a fluorine-containing polymer having no associable group.

By using a solvent mixture of an aprotic fluorine-containing solvent and a protic fluorine-containing solvent, the protic fluorine-containing solvent will solvate at associated sites, whereby the association will be dissolved, and polymer A will disperse in the solvent at a molecular level. As a result, it becomes possible to prevent gelletion or reduction of the viscosity of the solution. It is believed that accordingly, it becomes easy to carry out precision filtration of the solution of polymer A or to control the reaction for introducing a functional group to the polymer having a fluorine-containing aliphatic cyclic structure.

As the polymer having a fluorine-containing aliphatic cyclic structure, the one obtainable by polymerizing a monomer having a fluorine-containing cyclic structure, or a polymer having a cyclic structure on its main chain, which is obtainable by cyclic polymerization of a fluorine-containing monomer having at least two polymerizable double bonds, may widely be exemplified including those which are known or well known.

The polymer having a cyclic structure on its main chain, which is obtainable by cyclic polymerization of a fluorine-containing monomer having at least two polymerizable double bonds, is known, for example, by Japanese Unexamined Patent Publication No. 238111/1988 or No. 238115/1988. Namely, it can be prepared by homopolymerization of a monomer such as perfluoro(allylvinyl ether) or perfluoro(butenylvinyl ether), or by copolymerization thereof with a radical polymerizable monomer such as tetrafluoroethylene.

Further, the polymer having a cyclic structure on its main chain, which is obtainable by polymerizing a monomer having a fluorine-containing cyclic structure, is known, for example, by Japanese Examined Patent Publication No. 18964/1988. Namely, it can be obtained by homopolymerization of a monomer having a fluorine-containing cyclic structure such as perfluoro(2,2-dimethyl-1,3-dioxole), or by copolymerization thereof with a radical polymerizable monomer such as tetrafluoroethylene.

Otherwise, it may be a polymer obtainable by copolymerizing a monomer having a fluorine-containing cyclic structure such as perfluoro(2,2-dimethyl-1,3-dioxole) with a fluorine-containing monomer having at least two polymerizable double bonds, such as perfluoro(butenylvinyl ether).

Another monomer which can be copolymerized together with the above tetrafluoroethylene or in place of tetrafluoroethylene, is not particularly limited so long as it is a monomer having radical polymerizability, and a fluorine-containing type, a hydrocarbon type, etc. can widely be exemplified.

For example, a perfluoroalkylvinyl ether such as perfluoromethylvinyl ether or perfluoropropylvinyl ether, a perfluorovinyl ether containing a functional group such as a carboxylic acid group or a sulfonic acid group, or a fluorine-containing unsaturated hydrocarbon such as vinylidene fluoride, vinyl fluoride or chlorotrifluoroethylene, may suitably be used.

As the polymer having a fluorine-containing aliphatic cyclic structure, a polymer having the cyclic structure on its main chain is suitable for use. However, from the viewpoint of the transparency, mechanical properties, etc., the one containing at least 20% of repeating units having the cyclic structure, based on the total number of repeating units, is preferred. More preferred is the one containing at least 40%.

The role of polymer A in the present invention is to improve the adhesion to various substrates of the polymer having the fluorine-containing aliphatic cyclic structure and to improve the mechanical strength of the polymer by the crosslinked structure formed by the reaction of the functional groups to one another, by itself or in combination with a coupling agent. Further, it also plays an important role to uniformly disperse various inorganic fillers or colorants in polymer A without flocculation.

For example, there is a coupling group of the formula $-MR^1_{n-a}R^2_a$ wherein M is selected from Si, Ti, Zr, Hf, Th and Al, $R^1$ is selected from a halogen group, a hydroxyl group, an amino group and $-OR^3$ (wherein $R^3$ is a monovalent organic group), $R^2$ is a monovalent organic group, n is 2 or 3, and a is selected from 0, 1 and 2 (provided that when n is 2, a is selected from 0 and 1). Such a coupling group contains $-MR^1$ as a group highly reactive with an inorganic substrate, whereby an excellent adhesion is believed to be obtained.

Here, preferred examples of $R^1$ include a halogen atom such as chlorine or fluorine, a hydroxyl group, an alkoxy group, an alkoxy-substituted alkoxy group, a hydroxyalkyloxy group, an acyloxy group, an aminoxy group, a ketoxime group, an amino group and an amide group.

Especially when the stability of the composition, the reactivity with an organic substrate, the influence of a by-product by the reaction, etc. are taken into consideration, an alkoxy group having from 1 to 4 carbon atoms, is preferred. When the coupling group has such an alkoxy group, the stability of the composition will be good, and a by-product formed during the coating will present no substantial adverse effect. Further, $R^1$ bonded to one M may be two or more different types, so long as $R^1$ is within the above defined range.

M is preferably Si, Ti, Zr or Al. With others, it is difficult to obtain a precursor, and the production is not easy. Especially the one wherein M is Si, is preferably employed, since it shows an extremely strong adhesion to an inorganic substrate without impairing the transparency.

Although $R^2$ is a monovalent organic group, $-MR^2$ may not necessarily have a reactivity. As such $R^2$, an alkyl group or an allyl group may, for example, be mentioned. Such a group is preferably the one having from 1 to 10 carbon atoms.

Such a coupling group may, for example, be a trimethoxysilyl group, a triethoxysilyl group, a methyldimethoxysilyl group, a triethoxytitanium group, a tributoxyzirconium group or a trimethoxyhafnium group.

As a method for introducing coupling groups to the polymer having a fluorine-containing aliphatic cyclic structure, a method may, for example, be mentioned wherein a compound of the formula $X-MR^1_{n-a}R^2_a$ wherein X is an alkyl group or a vinyl group having at least one functional atom or group selected from the group consisting of a chlorine atom, an amino group, an aminoalkyl group, an ureido group, a glycidoxy group, an epoxy group, an isocyanate group and an acryloyl group, and M, $R^1$, $R^2$, n and a are as defined above, is reacted to a polymer having a fluorine-containing aliphatic cyclic structure having a reactive group such as a carboxyl group, an alkoxycarbonyl group or a hydroxyl group.

Here, the polymer having a fluorine-containing aliphatic cyclic structure having a reactive group, can be prepared in the same manner as the above described preparation of the polymer having a fluorine-containing aliphatic cyclic structure. Namely, usually, using an organic peroxy compound as an initiator, a monomer having a fluorine-containing cyclic structure is polymerized to obtain a polymer having a fluorine-containing aliphatic cyclic structure having a reactive group such as $-COOH$ or $-COOCH_3$ at the terminal.

Further, at the time of preparing the polymer having a fluorine-containing aliphatic cyclic structure, the reactive group can be positively introduced by copolymerizing a monomer having a reactive group, such as $CF_2=CFOCF_2CF(CF_3)O-(CF_2)_3-COOCH_3$.

The coupling groups can be introduced by reacting a compound having the above-mentioned coupling group to the polymer having a fluorine-containing aliphatic cyclic structure, which has such a reactive group. Such a reaction is preferably conducted by treatment at a temperature of from 10° to 50° C. for from 2 to 5 hours.

Further, at the time of preparing the polymer having a fluorine-containing aliphatic cyclic structure, coupling groups can be introduced by copolymerizing a monomer having a radical polymerizable group and a coupling group, such as vinyl trimethoxysilane or vinyl triethoxysilane.

If the quantity of coupling groups introduced is too small, no adequate effect for improving adhesion, etc. will be obtained. On the other hand, if it is too much, the inherent properties of the polymer having a fluorine-containing aliphatic cyclic structure are likely to deteriorate, or the stability of the composition is likely to deteriorate, thus leading to gelletion. Therefore, the quantity of the coupling groups to be introduced, is preferably suitably selected depending upon the particular purpose. Usually, the adhesion can be improved by introducing one coupling group per molecule of the polymer.

Further, the adhesion can be improved even when not all of the polymers having fluorine-containing aliphatic cyclic structures, present in the composition are polymers having coupling groups. For example, the adhesion can adequately be improved when about 1/20 (weight ratio) of the polymers having fluorine-containing aliphatic cyclic structures contained in the composition are polymers having at least one coupling group.

Usually, the polymer having a fluorine-containing aliphatic cyclic structure has a functional group such as a carboxylic acid group derived from an initiator or a chain transfer agent, at a terminal. By converting this carboxylic acid group to an ester group or further to a maleimide group or an amino group, various functional groups can be introduced into the polymers. Further, to improve the effects of the present invention by increasing the quantity of such functional groups introduced, a small amount of $CF_2=CFO(CF_2)_3COOCH_3$,
$CF_2=CFOCF_2CF(CF_3)O(CF_2)_3COOCH_3$,
$CF_2=CFO(CF_2)_3CH_2NH_2$ or
$CF_2=CFOCF_2CF(CF_3)SO_2F$, may be copolymerized.

When the functional group in polymer A is $-COX$ (wherein X is OH or OR, where R is a $C_{1-3}$ alkyl group), $-SO_2Y$ (wherein Y is F, Cl, OH or OR, wherein R is a $C_{1-3}$ alkyl group), $-NH_2$ or $-OH$, a colorant can readily be dispersed in polymer A. Such a carboxylic acid (ester) or sulfonic acid (ester) is reactive with an amino group in the colorant, and the amino group is reactive with a sulfonic acid group, a carboxylic acid group or a phosphoric acid group in the pigment.

In the present invention, as a method for introducing a maleimide group, firstly an amino group is introduced, and then the product may be reacted with maleic anhydride. With respect to the reaction conditions, a conventional method may be employed, but a method is preferred in which the polymer having a fluorine-containing aliphatic cyclic structure containing an amino group, and maleic anhydride are mixed by means of a solvent capable of dissolving both. Further, the reaction can be accelerated by an addition of an acid catalyst such as p-toluenesulfonic acid, benzenesulfonic acid or glacial acetic acid. The reaction temperature is preferably from room temperature to 150° C.

A method for introducing an amino group is not particularly limited, and a conventional method may be employed. However, if the modifying group portion is extremely long, the solubility tends to be poor, such being undesirable. For example, it is effective to employ a method wherein a carboxylic acid group present in the polymer having a fluorine-containing aliphatic cyclic structure, is utilized and reacted with a diamine to convert it to an amino group, or a method wherein ammonia is reacted to a carboxylic acid group to form an amide, which is then converted to an amine by means of a reducing agent such as diborane-tetrahydrofuran or $AlCl_3$—$NaBH_4$. The above reaction may be conducted after the carboxylic acid group is esterified. Further, it is possible to employ the above-mentioned method of copolymerizing an amino group-containing monomer.

Polymer A wherein the functional group is a maleimide group, will undergo a crosslinking reaction even alone. However, by using it in combination with polymer A wherein the functional group is an amino group, a crosslinked product can readily be obtained under a relatively mild condition. A composition containing such two types of polymers, can be crosslinked by heating at a temperature of from 150° to 300° C.

Polymer A having a maleimide group as the functional group and polymer A having an amino group as the functional group, can be mixed at an optional ratio in a solvent mixture of an aprotic fluorine-containing solvent and a protic fluorine-containing solvent. However, from the viewpoint of the physical properties of the polymer after crosslinking under heating, it is preferred that the content of the polymer having a fluorine-containing aliphatic cyclic structure containing a maleimide group is from 20 to 100 wt %, preferably from 30 to 70 wt %, based on the sum of the two polymers. If the content of maleimide groups is small, the crosslinking reaction tend to be inadequate.

Polymer A wherein the functional group is a cyano group, is also useful. As a method for introducing a cyano group into the polymer, there may be mentioned 1) a method wherein a cyano group-containing monomer is subjected to radical copolymerization, or 2) a method wherein an alkoxycarbonyl group introduced at a terminal of a side chain or the main chain, is converted by ammonia to an amide, followed by dehydration with phosphorus pentoxide or trifluoroacetic anhydride/pyridine for conversion to a cyano group.

The cyano group-containing monomer may, for example, be a cyano group-containing vinyl ether such as perfluoro(3,5-dioxa-4-methyl-7-octenonitrile), perfluoro(4,7-dioxa-5-methyl-8-nonenonitrile), perfluoro(5,8-dioxa-6-methyl-9-decenonitrile), perfluoro(5-oxa-6-heptenonitrile), perfluoro(6-oxa-7-octenonitrile), perfluoro(7-oxa-8-nonenonitrile) or perfluoro(2,5-dimethyl-4-7-dioxa-8-nonenonitrile), a cyano group-containing α-olefin such as perfluoro(3-butenonitrile), perfluoro(4-pentenonitrile) or perfluoro(5-hexenonitrile), or perfluoroacrylonitrile.

It is preferred that on average, at least two cyano groups are introduced per molecule of the polymer. In a case where alkoxycarbonyl groups are introduced to side chains and then converted to cyano groups, such alkoxycarbonyl groups may be introduced by copolymerizing a monomer having a structure of the above-mentioned cyano group-containing monomer wherein the cyano group is substituted by an alkoxycarbonyl group.

Polymer A having an amidine group (—C(=NH)NH$_2$) or an imidoylamidine group (—C(=NH)N=C(NH$_2$)—) as the functional group at a terminal of the main chain or a side chain of the polymer, can be obtained by reacting ammonia to polymer A having a cyano group at a terminal of the main chain or a side chain of the polymer.

In the case of polymer A wherein the functional group is an amidine group or an imidoylamidine group, the viscosity tends to increase or gelletion is likely to take place when an aprotic fluorine-containing solvent is used alone as the sole solvent. In such a case, it is possible to reduce the viscosity by adding from 0.01 to 50 parts by weight, preferably from 0.1 to 20 parts by weight, of a protic fluorine-containing solvent to 100 parts by weight of the aprotic fluorine-containing solvent. The protic fluorine-containing solvent may be used alone when polymer A can be thereby solved.

It is possible to obtain a crosslinked polymer having triazine rings, with the mechanical heat resistance at a high temperature improved, by heating polymer A having a cyano group at a terminal of the main chain or a side chain of the polymer in the presence of a catalyst which accelerates a triazine ring-forming reaction, or by heating a mixture of such polymer A with an amidine group-containing compound or an imidoylamidine group-containing compound, or by heating a polymer having the cyano group of such polymer A converted by ammonia to an amidine group or imidoylamidine group. For the above heating, a temperature of from 100° C. to 400° C., preferably from 200° C. to 350° C., is employed.

Further, it is possible to obtain a coating film of the crosslinked polymer having triazine rings, by coating a solution of polymer A wherein the functional group is a cyano group, on a substrate, followed by contacting it with ammonia gas at a temperature of from 100° C. to 400° C., preferably from 200° C. to 350° C.

As the amidine group-containing compound or the imidoylamidine group-containing compound, compounds shown in the following kal may, for example, be mentioned. A wide range of other compounds having an amidine group or an imidoylamidine group may also be employed.

kal

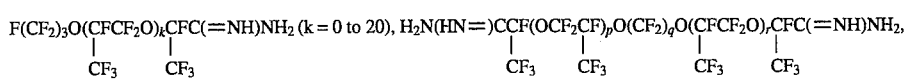

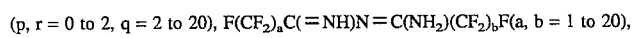

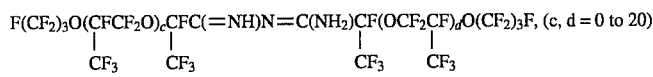

As the catalyst which promotes a triazine ring-forming reaction i.e. the catalyst which promotes a triazine ring-forming reaction by trimerization of cyano groups, an organic peroxide type catalyst, a bis-azo compound type catalyst or a transition metal compound type catalyst may, for example, be used. The transition metal compound type catalyst is preferably employed, and specifically, a perfluorocarboxylic acid salt of e.g. zinc, manganese or cobalt, tetrabutyltin and tetraphenyltin may, for example, be mentioned. As other examples, many compounds of transition metals such as copper, silver, cadmium, bismuth, lead and barium may be employed. Particularly preferred is the perfluorocarboxylic acid salt, since it has good solubility in a fluorine-containing solvent. Further, it is possible to facilitate the crosslinking reaction by an addition of a peroxide such as tert-butyl hydroperoxide.

The molecular weight of polymer A varies depending upon the polymer composition or the particular application. However, basically, there is no upper limit in the molecular weight, so long as polymer A is soluble in the solvent mixture of an aprotic fluorine-containing solvent and a protic fluorine-containing solvent, and the viscosity of the solution is not higher than $10^6$ cP, preferably not higher than $10^5$ cP, more preferably not higher than $10^4$ cP.

To be used as a coating material, the one having a number average or weight average molecular weight of from about $10^3$ to $10^7$, more preferably from $10^4$ to $5 \times 10^6$, is preferred. If the molecular weight is too small, the polymer tends to be brittle, or the excellent physical properties such as heat resistance inherent to polymer A may sometimes be impaired, such being undesirable.

The average molecular weight may directly be obtained by e.g. a light scattering method, an osmotic pressure method or a melt-viscosity method. Further, if a calibration curve is prepared by using the data obtained by such a method, the molecular weight can be calculated after measuring the specific viscosity [η] or gel permeation chromatography. The molecular weight can also be obtained by the analysis of the terminals groups by an infrared absorption spectrum or a nuclear magnetic resonance spectrum. Polymer A preferably has a specific viscosity [η] of from 0.02 to 5 dl/g, more preferably from 0.05 to 1 dl/g, as measured at 30° C. in perfluoro(2-butyltetrahydrofuran).

The aprotic fluorine-containing solvent is a solvent which does not dissociate to form protons under a usual reaction condition. As such a solvent, the following fluorine-containing compounds may, for example, be mentioned.

A fluorine-containing aromatic hydrocarbon such as perfluorobenzene, pentafluorobenzene, 1,3-bis(trifluoromethyl)benzene or 1,4-bis(trifluoromethyl)benzene; a fluorine-containing alicyclic hydrocarbon such as perfluorodecalin, perfluorocyclohexane or perfluoro(1,3,5-trimethylcyclohexane); a fluorine-containing alkylamine such as perfluorotributylamine or perfluorotripropylamine; a fluorine-containing cyclic ether such as perfluoro(2-butyltetrahydrofuran), a fluorine-containing polyether such as a fluorine-containing low molecular weight polyether; a fluorine-containing ketone such as bis(heptafluoroisopropyl)ketone; as well as a fluorine-containing aliphatic hydrocarbon such as perfluorohexane, perfluorooctane, perfluorodecane, perfluorododecane, perfluoro(2,7-dimethyloctane), 3,3-dichloro-1,1,1,2,2-pentafluoropropane, 1,3-dichloro-1,1,2,2,3-pentafluoropropane, perfluoro(1,2-dimethylhexane), perfluoro(1,3-dimethylhexane), 2H,3H-perfluoropentane, 1H-perfluorohexane, 1H-perfluorooctane, 1H-perfluorodecane, 1H,1H,1H,2H,2H-perfluorohexane, 1H,1H,1H,2H, 2H-perfluorooctane, 1H,1H,1H,2H,2H-perfluorodecane, 3H,4H-perfluoro-2-methylpentane or 2H,3H-perfluoro-2-methylpentane.

These aprotic fluorine-containing solvents may be used alone or as a mixture of two or more of them.

The protic fluorine-containing solvent is a solvent which dissociates to readily release protons under a usual reaction condition. As such a solvent, the following fluorine-containing compounds may, for example, be mentioned.

A fluorine-containing alcohol such as trifluoroethanol, 2,2,3,3,3-pentafluoro-1-propanol, 2 -(perfluorobutyl)ethanol, 2-(perfluorohexyl)ethanol, 2-(perfluorooctyl)ethanol, 2-(perfluorodecyl)ethanol, 2 -(perfluoro-3-methylbutyl)ethanol, 1H,1H,3H-tetrafluoro-1-propanol, 1H,1H,5H-octafluoro-1-pentanol, 1H,1H,7 H-dodecafluoro-1-heptanol, 1H,1H,9H-hexadecafluoro-1-nonanol, 2H-hexafluoro-2-propanol or 1H,1H,3H-hexafluoro- 2-butanol; as well as a fluorine-containing carboxylic acid such as trifluoroacetic acid, a perfluoropropanoic acid, perfluorobutanoic acid, perfluoropentanoic acid, perfluorohexanoic acid, perfluoroheptanoic acid, perfluorooctanoic acid, perfluorononanoic acid, perfluorodecanoic acid, 3H-tetrafluoropropanoic acid, 5H-octafluoropentanoic acid, 7H-dodecafluoropentanoic acid or 9H-hexadecafluorononanoic acid, an amide of such a fluorine-containing carboxylic acid, and a fluorine-containing sulfonic acid such as trifluoromethanesulfonic acid or heptadecafluorooctanesulfonic acid.

These protic fluorine-containing solvents may be used alone or as a mixture of two or more of them. The concentration of polymer A in the mixture of the aprotic fluorine-containing solvent and the protic fluorine-containing solvent is usually fro 0.1 to 30 wt %, preferably from 0.5 to 20 wt %. The proportions of the aprotic fluorine-containing solvent and the protic fluorine-containing solvent are such that the protic fluorine-containing solvent is from 0.01 to 50 parts by weight, preferably from 0.1 to 30 parts by weight, per 100 parts by weight of the aprotic fluorine-containing solvent.

In order to improve the adhesion of the polymer having a fluorine-containing aliphatic ring structure to various substrates, it has been practiced to mix a silane coupling agent to the polymer solution (Japanese Unexamined Patent Publication No. 19575/1991). However, in order to produce sufficient adhesion, a large amount of the coupling agent which is larger than the equivalent amount of the functional group in the polymer, is required, while the mixture of the polymer having a fluorine-containing aliphatic cyclic structure/aprotic fluorine-containing solvent/the silane coupling agent, as disclosed in Japanese Unexamined Patent Publication No. 19575/1991, has a problem such that the viscosity increases with time, or filtration tends to be difficult. Further, depending upon the type of the coupling agent, there will be a problem that it is difficult to dissolve it in a large amount.

Such an increase of the viscosity of the solution with time can be suppressed by mixing the aprotic fluorine-containing solvent and the protic fluorine-containing solvent. Further, it has been surprisingly found that if the amount of the silane coupling agent is increased to a level larger than the equivalent amount of the functional group in the polymer, the increase of the viscosity can be suppressed rather than the case where the amount is less than the equivalent amount. It is thereby possible to obtain a solution having good long term storage stability. The functional mechanism for suppressing the increase of the viscosity is not clearly understood. However, it is considered that association of the silane coupling agent moieties bonded to the terminals of the polymer in the aprotic fluorine-containing solvent, is prevented by the protic fluorine-containing solvent, and consequently, the condensation of the coupling agent moieties is suppressed.

In the present invention, the silane coupling agent is a silane compound having a hydrolyzable group and other organic group, or a silane compound having only a hydrolyzable group. As the hydrolyzable group, an alkoxy group, an alkoxyalkoxy group, an acyloxy group, an aryloxy group, an aminoxy group, an amide group, a ketoxime group, an isocyanate group or a halogen atom may, for example, be mentioned. Preferred is a group having a hydrogen atom removed from a hydroxyl group of a monohydric alcohol, such as an alkoxy group, an alkoxyalkoxy group.

As the organic group other than the hydrolyzable group, it is common to have one organic group having a functional group, and when a further organic group is present, such a group is usually an organic group having no functional group. As the functional group in the organic group having a functional group, an amino group, an epoxy group, a mercapto group or an isocyanate group may, for example, be mentioned.

As such a silane coupling agent, a wide range of agents including known or well known agents may be employed, and the following agents may be used alone or in combination.

A monoalkoxysilane such as vinyltriethoxysilane, trimethylmethoxysilane, trimethylethoxysilane, dimethylvinylmethoxysilane or dimethylvinylethoxysilane. A dialkoxysilane such as γ-chloropropylmethyldimethoxysilane, γ-chloropropylmethyldiethoxysilane, γ-aminopropylmethyldiethoxysilane, γ-aminopropylmethyldimethoxysilane, N-β-(aminoethyl)-γ-aminopropylmethyldimethoxysilane, N-β-(aminoethyl)-γ-aminopropylmethyldiethoxysilane, γ-glycidoxypropylmethyldimethoxysilane, γ-glycidoxypropylmethyldiethoxysilane, γ-methacryloxypropylmethyldimethoxysilane, methyldimethoxysilane, methyldiethoxysilane, dimethyldimethoxysilane, dimethyldiethoxysilane, methylvinyldimethoxysilane, methylvinyldiethoxysilane, diphenyldimethoxysilane, diphenyldiethoxysilane, 3,3,3-trifluoropropylmethyldimethoxysilane, 3,3,4,4,5,5,6,6,7,7,8,8,8-tridecafluorooctylmethyldimethoxysilane or 3,3,4,4,5,5,6,6,7,7,8,8,9,9,10,10,10-heptadecafluorodecylmethyldimethoxysilane.

A tri- or tetra-alkoxysilane such as γ-aminopropyltrimethoxysilane, γ-aminopropyltriethoxysilane, N-β-(aminoethyl)-γ-aminopropyltrimethoxysilane, N-β-(aminoethyl)-γ-aminopropyltriethoxysilane, γ-mercaptopropyltrimethoxysilane, γ-glycidoxypropyltrimethoxysilane, γ-glycidoxypropyltriethoxysilane, γ-methacryloxypropyltrimethoxysilane, γ-chloropropyltrimethoxysilane, methyltriethoxysilane, phenyltrimethoxysilane, phenyltriethoxysilane, 3,3,3-trifluoropropyltrimethoxysilane, 3,3,4,4,5,5,6,6,7,7,8,8,8-tridecafluorooctyltrimethoxysilane, 3,3,4,4,5,5,6,6,7,7,8,8,9,9,10,10,10-heptadecafluorododecyltrimethoxysilane, tetramethoxysilane or tetraethoxysilane.

An aromatic amine compound of the formula $ArSi(OR^1)(OR^2)(OR^3)$, $ArSiR^4(OR^1)(OR^2)$ or $ArSiR^4R^5(OR^1)$ wherein each of $R^1$ to $R^5$ independently presents H or an alkyl group or an aryl group having from 1 to 20 carbon atoms, Ar is a p-, m- or o-aminophenyl group.

Specific examples of the aromatic amine compound include aminophenyltrimethoxysilane, aminophenyltriethoxysilane, aminophenyltripropoxysilane, aminophenyltriisopropoxysilane, aminophenylmethyldimethoxysilane, aminophenylmethyldiethoxysilane, aminophenylmethyldipropoxysilane, aminophenylmethyldiisopropoxysilane, aminophenylphenyldimethoxysilane, aminophenylphenyldiethoxysilane, aminophenylphenyldipropoxysilane and aminophenylphenyldiisopropoxysilane.

Hydrogen atoms of the amino group in the aromatic amine compound may be substituted by alkyl groups or aryl groups. For example, N,N-dimethylaminophenyltrialkoxysilane or N,N-dimethylaminophenylmethyldialkoxysilane may be mentioned. Other than these, aromatic amine type silane coupling agents disclosed in U.S. Pat. No. 3,481,815 may, for example, be used.

Among these silane coupling agents, a silane coupling agent having an amino group, such as γ-aminopropyltriethoxysilane, γ-aminopropylmethyldiethoxysilane, γ-aminopropyltrimethoxysilane, γ-aminopropylmethyldimethoxysilane, N-β-(aminoethyl)-γ-aminopropyltrimethoxysilane, N-β-(aminoethyl)-γ-aminopropylmethyldimethoxysilane, N-β-(aminoethyl)-γ-aminopropyltriethoxysilane, N-β-(aminoethyl)-γ-aminopropylmethyldiethoxysilane, aminophenyltrimethoxysilane, aminophenyltriethoxysilane, aminophenylmethyldimethoxysilane or aminophenylmethyldiethoxysilane, or a silane coupling agent having an epoxy group such as γ-glycidoxypropyltrimethoxysilane, γ-glycidoxypropylmethyldimethoxysilane, γ-glycidoxypropyltriethoxysilane or γ-glycidoxypropylmethyldiethoxysilane, is particularly preferred for the purpose of improving the adhesive property of polymer A without impairing the transparency of polymer A.

To polymer A having a carboxyl group preliminarily introduced at a terminal of the main chain or in a side chain, an alkoxysilane having an amino group or an epoxy group is particularly effective. To polymer A having an ester group preliminarily introduced at a terminal of the main chain or in a side chain, an alkoxysilane having an amino group or an aminophenyl group is particularly effective.

When a sealing film of a semiconductor part or the like is prepared by using a coating film of polymer A, the polymer may be exposed to a high temperature at a level of at least 300° C., whereby the heat resistance of the silane coupling agent becomes critical in order to maintain the adhesion between the element and the coating film. With an aliphatic silane coupling agent such as α-daminopropyltrialkoxysilane, the heat resistant adhesion may sometimes be inadequate. In such a case, it is effective for the improvement of the heat resistant adhesion to employ a silane coupling agent having an aromatic ring in its molecule, such as aminophenyltrimethoxysilane.

Many aromatic ring-containing silane coupling agents have poor solubility in aprotic fluorine-containing solvents, and it is difficult to mix a necessary amount of such a silane coupling agent to obtain adequate adhesion. However, by using a solvent mixture of an aprotic fluorine-containing solvent and a protic fluorine-containing solvent, the necessary amount of an aromatic ring-containing silane coupling agent can sufficiently be dissolved. The proportion of the silane coupling agent is from 0.01 to 50 parts by weight, preferably from 0.1 to 30 parts by weight, per 100 parts by weight of polymer A.

When polymer A is used as an anti-reflection coating agent for an acrylic resin surface, a polycarbonate resin surface or a glass surface for lenses or for display devices such as LCD, the coating film surface is required to be hardly scratchable. Further, when applications as sealers or adhesives to various electric and electronic parts, are considered in view of the lower water absorptivity than the epoxy resins, an improvement of the mechanical properties such as creep resistance, is required. To satisfy these requirements, it is effective to disperse various inorganic fillers in polymer A. By using an inorganic filler and the above-mentioned silane coupling agent in combination, the above-mentioned mechanical properties can further be improved.

Typical examples of the inorganic filler to be used in the present invention, include metal oxides such as silica, titania, alumina, silica alumina, yellow iron oxide, chromium oxide, zinc oxide, zirconia, serium oxide, magnesium oxide, tin oxide, antimony oxide, kaolin and iron oxide, metal nitrides such as aluminum nitride, silicon nitride and boron nitride, metal carbonates such as silicon carbonate, silicates such as mica, talc, sericite, yellow soil, iron blue, ultramarine blue, aluminum silicate, magnesium silicate, calcium silicate, magnesium silicate aluminate and magnesium metasilicate aluminate, phosphates such as mangoviolet, cobalt violet and calcium phosphate, metal hydroxides such as aluminum hydroxide and chromium hydroxide, carbonates such as calcium carbonate, magnesium carbonate and calcium aluminacarbonate, titanates such as iron titanate, barium titanate and cobalt titanate, sulfates such as barium sulfate, and metals such as aluminum and copper. These fillers may be used alone or as a mixture of two or more of them.

As to the shape of such an inorganic filler, a pulverized form, a spherical form, a plate form or needle-like form may, for example, be mentioned. However, the shape is not particularly limited. The average particle size is from 0.1 to 100 μm, preferably from 0.1 to 50 μm. If the average particle size exceeds 100 μm, the dispersibility in polymer A tends to be poor, and if the average particle size is less than 0.1 μm, the viscosity of polymer A tends to be extremely high, and the operation efficiency tends to be poor, such being undesirable.

The particle size distribution of the inorganic filler may be such that a pulverized product by a ball mill, a vibration mill, an attritor, a roller mill, a jet mill or the like is sieved for classification or removal of coarse particle. Preferably, however, in a RRS particle size chart, the inclination of the linear line connecting one point within a range of from 10 to 30% of the cumulative wt % from the maximum particle size to one point within a range of from 70 to 90%, is at most 3. If this inclination exceeds 3, the fluidity of polymer A tends to be high, and the moldability tends to be poor.

Here, the RRS particle size chart is a particle size chart showing the particle size distribution according to the following formula of Rosin-Rammler. $R(Dp)=100e \times p(-bDpn)$ (where $R(Dp)$ is the cumulative wt % from the maximum particle diameter to the particle size $Dp$, and $Dp$ is the particle diameter, and each of b and n is a constant.) The inclination in the RRS particle size chart corresponds to value n in the formula of Rosin-Rammler represented by the linear line connecting one point within a range of from 10 to 30% of the cumulative wt% from the maximum particle diameter in the RRS particle size chart to one point within a range of from 70 to 90%.

In the present invention, the proportion of the inorganic filler is preferably from 20 to 90 wt % based on the total amount of polymer A and the inorganic filler, and further the silane coupling agent, if necessary. More preferably, the proportion is from 30 to 80 wt %. If the proportion is less than 20 wt %, no adequate effect for moisture permeability will be obtained, and if it exceeds 90 wt %, bulkiness tends to be so large that the moldability will be poor, and water absorptivity tends to be poor, such being practically unsuitable.

In order to obtain a coating film of polymer A, which is optically transparent and homogeneous and which has a smooth surface, it is effective to disperse in polymer A an inorganic filler having an average particle diameter of not larger than 1 μm, which scarcely scatters light. In order to disperse an inorganic filler having an average particle diameter of not larger than 1 μm in polymer A without increasing the viscosity of polymer A, it is effective to employ an organosol having the inorganic filler dispersed in a solvent mixture of an aprotic fluorine-containing solvent and a protic fluorine-containing solvent. Into the solvent mixture, a fluorine-containing surfactant may be incorporated in order to improve the dispersion stability or transparency of the organosol.

The organosol having the inorganic filler dispersed in the solvent mixture of an aprotic fluorine-containing solvent and a protic fluorine-containing solvent, can be obtained by the following methods.

(1) A fluorine-containing surface treating agent is added and reacted to an organosol of the inorganic filler, then the dispersing medium of the organosol is distilled off, and the obtained solid content is dispersed in a solvent mixture of an aprotic fluorine-containing solvent and a protic fluorine-containing solvent.

(2) A fluorine-containing surface treating agent is added and reacted to an organosol of the inorganic filler, and then the reaction solution is dispersed in a solvent mixture of an aprotic fluorine-containing solvent and a protic fluorine-containing solvent.

The organosol of the inorganic filler is usually available as an organosol employing as a dispersing medium an organic solvent compatible with water, such as dimethylformamide or an alcohol such as methanol, ethanol, isopropyl alcohol or cellosolve. There is no particular restriction as to the particle size of the organosol, so long as it is available as an organosol. However, the average particle size of an organosol is usually within a range of from 5 nm to 500 nm, and it is possible to obtain a molded product having excellent transparency, when the particle size is not larger than 1000 nm, preferably not larger than 500 nm, more preferably not larger than 100 nm.

Usually readily available as an organosol is silica sol. However, the organosol is not limited to silica sol.

With respect to the fluorine-containing surface treating agent to be used, it is possible to employ the one capable of reacting with the surface of the inorganic compound to impart water and oil repellency. For example, the following compounds (ka2) and (ka3) disclosed in Japanese Unexamined Patent Publication No. 188012/1991 and a compound such as a silane coupling agent (ka4), may be employed. These compounds may be used in combination.

ka2

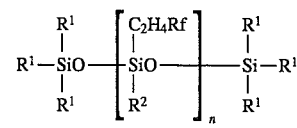

ka3

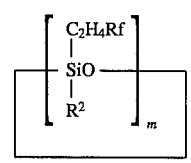

ka4

$RfC_2H_4SiX_3$

In the formulae, ka1 to ka3, Rf is a perfluoroalkyl group having from 1 to 21 carbon atoms and having a linear or branched structure, and the plurality of $R^1$ are monovalent organic groups, which may be the same or different from one another, $R^2$ is a hydrogen atom or a monovalent organic group, X is a hydrolyzable group such as a halogen atom, an alkoxy group or an amino group, n is an integer of at least 1, preferably from 1 to 5000, and m is an integer of at least 3, preferably from 3 to 12.

As the silane coupling agent, compounds as shown in ka5 may also be employed.

ka5
$Rf(CH_2)_kSiX_3$ (k=1 to 5),
$Rf(CH_2)_kSi(R^1)X_2$ (k=1 to 5),
$RfCONHSiX_3$,
$RfCONH(CH_2)_2SiX_3$,
$RfCONH(CH_2)_3SiX_3$,
$RfSO_2NHCH_2CH_2N(RfSO_2)(CH_2)_3SiX_3$,
$RfSO_2NH(CH_2)_2SiX_3$,
$RfSO_2NH(CH_2)_2Si(R^1)X_2$,
$RfSO_2NH(CH_2)_3SiX_3$,
$RfSO_2NH(CH_2)_3Si(R^1)X_2$,
$RfCOO(CH_2)_2SiX_3$,
$RfCOO(CH_2)_2Si(R^1)X_2$,
$RfO(CH_2)_3Si(R^1)X_2$,
$RfO(CH_2)_3SiX_3$,
$(Rf(CH_2)_2)_2SiX_2$.

As other examples, fluorine-containing surface treating agents as shown in ka6 may also be employed.

ka6 $Rf(CH_2)_kSi(NH_2)_2NHSi((CH_2)_kRf)(NH_2)_2$ (k=1 to 5)
$Rf(CH_2)_kSi(NH_2)_2$ $NHSi((CH_2)_kRf)(NH_2)$—
$NHSi((CH_2)_kRf)(NH_2)_2$ (k=1 to 5)
$(RfCH_2CH_2O)_2P(O)ON(H_2)(CH_2CH_2OH)_2$,
$RfCH_2CH_2OP(O)(ON(H_2)(CH_2CH_2OH)_2)_2$.

In the formulae in ka1 to 5, Rf is a linear or branched perfluoroalkyl group having from 1 to 21 carbon atoms, the plurality of $R^1$ are monovalent organic groups which may be the same or different, $R^2$ is a hydrogen atom or a monovalent organic group, X is a hydrolyzable group such as a halogen atom, an alkoxy group or an amino group, n is an integer of at least 1, preferably from 1 to 5000, and m is an integer of at least 3, preferably from 3 to 12.

The Rf group of the fluorine-containing surface treating agent may, for example, be $F(CF_2)_u$—, $(CF_3)_2CF(CF_2)_v$—, $CF_3(CF_2)_2O(CF(CF_3)CF_2O)_wCF(CF_3)$—, $F(CF_2)_{u-1}O(CF_2)_2$—, $(CF_3)_2CF(CF_2)_{v-1}O(CF_2)_2$— or $CF_3(CF_2)_2O(CF(CF_3)CF_2)_{w+1}O(CF_2)_2$—, wherein u is from 1 to 21, v is from 0 to 18, and w is from 1 to 5, and the fluorine atoms of the Rf group may partly be substituted by hydrogen atoms or chlorine atoms.

In a silane coupling agent having a linear perfluoroalkyl group $F(CF_2)_u$—, u is preferably larger than 4, and especially when u=6, it is possible to obtain an organosol excellent in the stability and the transparency.

The method of obtaining an organosol having the inorganic filler dispersed by means of a fluorine-containing surface treating agent such as a fluorine-containing silane coupling agent, may be facilitated by an addition of water, an acid or a base, as the case requires. Usually, an acid such as acetic acid, hydrochloric acid, sulfuric acid or p-toluenesulfonic acid, or a base such as ammonia, is used. However, the additive is not limited to such specific examples.

Further, as a reactive additive, a compound such as an organic titanate, an aluminum alcoholate, an aluminum xylate or a cyclic aluminum oligomer, as disclosed in Japanese Unexamined Patent Publication No. 197420/1989, may be employed. For example, tetra-i-propyl titanate, tetra-n-butyl titanate, titanium di-i-propoxy-(acetylacetonate), aluminum isopropylate, aluminum s-butylate, aluminum tris(acetylacetonate) or a cyclic aluminum oxide isopropylate, may, for example, be mentioned. The reaction is conducted usually at a temperature of from 0° C. to 300° C., preferably from 20° to 200° C.

The amount of the fluorine-containing surface treating agent is at least 10 parts by weight, preferably at least 20 parts by weight, more preferably at least 30 parts by weight, per 100 parts by weight of the inorganic filler. If the amount is small, it tends to be difficult to disperse it finely and stably in the solvent mixture of an aprotic fluorine-containing solvent and a protic fluorine-containing solvent, and turbidity or precipitation of solid is likely to result, such being undesirable. If the amount is large, the stability increases, but the content of the inorganic filler in the coating film tends to be small, and the effect of the addition of the filler tends to be small. Therefore, the upper limit of the amount of the fluorine-containing surface treating agent is properly at a level of 200 parts by weight.

To the organosol having the inorganic filler dispersed therein, thus obtained, it is possible to dissolve polymer A. Polymer A may be dissolved as it is, or the one having polymer A preliminarily dissolved in a solvent mixture of an aprotic fluorine-containing solvent and a protic fluorine-containing solvent, may be mixed with the organosol.

The proportion of the inorganic filler in the organosol is from 0.01 to 30 wt %, preferably from 0.1 to 20 wt %. The proportion of polymer A in the dispersing medium of the organosol is from 0.01 to 30 wt %, preferably from 0.1 to 20 wt %.

Polymer A is excellent in the transparency and soluble in a solvent. However, conventional solvents for polymer A do not dissolve a colorant, and therefore, it was impossible to uniformly disperse the colorant even in a solution state. By using the solvent mixture of an aprotic fluorine-containing solvent and a protic fluorine-containing solvent, it is possible to obtain a polymer A solution having a colorant uniformly dispersed.

By selecting a colorant having a functional group reactive with the functional group present in polymer A, dispersion of the colorant in polymer A can be maintained even after finally removing the solvent, whereby it is possible to disperse the colorant in a large amount of at least the stoichiometric amount of the functional group. Since the colorant is uniformly dispersed in polymer A without flocculation, only the light with a wavelength specific to the colorant may be absorbed while maintaining the original light transmittance of polymer A.

The colorant to be used in the present invention is not particularly limited. The one containing an amino group, a carboxylic acid group, a sulfonic acid group or a phosphoric acid group in its molecule is preferred to increase the content of the colorant in polymer A. A benzophenone derivative, an acridine derivative, a quinoline derivative, an isoquinoline derivative or a benzothiazole derivative, which is commonly used as an ultraviolet absorber, may, for example, be mentioned. Further, a spiropyrane derivative used as a photochromic material, may also be mentioned. Further, a porphyrin derivative or a quinizarin derivative which is useful as a photochemical hole burning (PHB), may also be mentioned. Further, in order to increase the content of polymer A, a perfluoroalkyl group (a linear or branched group having from 6 to 12 carbon atoms) may be introduced in such a colorant molecule.

The content of the colorant in polymer A is from 0.005 to 40 wt %, preferably from 0.01 to 20 wt %. If the content is less than this, no adequate light absorbing performance of the colorant will be obtained. On the other hand, if the content is large, it tends to be very difficult to uniformly disperse the colorant, and various properties of polymer A tend to be impaired, such being undesirable.

A fluorine-containing polymer other than polymer A may be used together with polymer A, depending upon the particular purpose. For example, an acrylate or methacrylate type fluorine-containing polymer having a polyfluoroalkyl group, may be used in combination and is effective for imparting water repellency or oil repellency.

Further, a hexafluoropropyleneoxide homopolymer, an amorphous fluorine-containing polymer of e.g. perfluoropolyether such as poly(perfluorotrimethyleneglycol) or a crystalline fluorine-containing polymer such as a copolymer of tetrafluoroethylene with propylene, a copolymer of hexafluoropropylene with vinylidene fluoride or a copolymer of polyfluorovinyl ether with tetrafluoroethylene, may be used in combination.

The crystallinity of the copolymer of polyfluorovinyl ether with tetrafluoroethylene can be reduced by increasing the vinyl ether content. Further, instead of tetrafluoroethylene, vinylidene fluoride, chlorotrifluoroethylene or trifluoroethylene may, for example, be used.

As the polyfluorovinyl ether, a perfluoroalkylvinyl ether such as perfluoropropylvinyl ether, a perfluorooxyalkylvinyl ether such as perfluoro(3,6-dioxa- 5-methyl-1-nonene), or an ester-containing vinyl ether such as methylperfluoro(4-vinyloxy-butanoate) or methylperfluoro(4,7-dioxa-5-methyl-8-nonenoate) may, for example, be mentioned.

To conduct coating by using the coating composition of the present invention, any one of conventional coating methods such as brushing, coating by means of a doctor blade, a bar coater or a flow coater, spray coating and spin coating, may be employed. Especially when smoothness is required, it is preferred to employ spin coating. The coating composition of the present invention can be applied to various uses, for example, as protective coatings in the optical or electrical field for e.g. optical fibers, lenses, mirrors, solar cells, optical discs, touch panels, semiconductor elements, hybrid IC, liquid crystal cells, printed boards, photosensitive drums, film capacitors, glass panes and various films, as protective, weather resistant and antifouling coatings in the medical and scientific fields for e.g. injection syringes, pipettes, clinical thermometers, beakers, Petri dishes and measuring cylinders as well as for solder masks, solder resists, rubbers and plastics, as protective coatings for e.g. fibers, cloths and foils, as antifouling coatings such as sealants, as sealing materials for integrated circuits such as IC and LSI or for semiconductor parts of e.g. transistors, as buffer coating films for semiconductor parts, as passivation films for semiconductor parts, as interlaminar insulating films for semiconductor parts in multimodules or integrated circuits, as interlaminar insulating films for multilayer circuit boards, as rust-preventive coating materials, as adhesives, as charge retaining recording materials, as resin-adhesion preventing agents and ink-adhesion preventing agents.

When it is used as an interlaminar insulating film or a protective film for a semiconductor element or an integrated circuit device, it is possible to obtain a semiconductor element integrated circuit device with a quick response speed and little error operation utilizing the properties of polymer A, such as low water absorptivity, low permittivity and high heat resistance. Further, the present invention is useful in a case where polymer A is required to maintain a shape at a high temperature of at least 200° C. in the process for the production of a semiconductor.

The composition of the present invention can advantageously be used as an anti-reflection film for e.g. a window material, a lens or a display of liquid crystal, CRT or plasma system. A television, a monitor, a video camera or a personal computer using a display of various systems, can provide a clear image by applying an anti-reflection film by coating of the composition of the present invention. Further, the composition of the present invention is useful also as an anti-reflection film for e.g. doors, show windows, windows for vehicles, windows for watches, coverings of frames, polarizing plates, windows for solar cells and windows for solar energy water heaters.

The display may be applied to various systems such as liquid crystal, CRT and plasma systems. It is also useful for an antifouling protective device called a pellicle which is used for preventing adhesion of foreign matters on a reticle and a photomask in the lithography process for the production of semiconductors.

The composition of the present invention containing an inorganic filler, is useful particularly as a material for e.g. a moisture-preventing film for electronic materials, an interlaminar insulating film, a pellicle or a sealing resin. If the inorganic filler is e.g. tin oxide, the electrical conductivity can be imparted, or if it is e.g. zinc oxide or titania, an ultraviolet ray absorbing ability can be imparted.

The composition of the present invention containing a silane coupling agent or an inorganic filler, is useful particularly for an application to bond and seal electronic or electrical parts. As examples of the application, sheathing of e.g. HIC, sheathing e.g. TAB. COG or COB, sealing of e.g. a transistor, a capacitor, a thermistor, a barristor or a piezoelectric element, and adhesion of e.g. a ceramic package, may be mentioned.

EXAMPLES

Examples 1 to 10 and Comparative Examples 1 to 3

A COOH group of a poly(perfluorobutenylvinyl ether) having the COOH group at its terminal (hereinafter referred to simply as PBVE) ([η]=0.09 dl/g) was treated with methanol and then reacted with ethylenediamine to convert it to an amino group (—CONHCH$_2$CH$_2$NH$_2$). Then, this terminal group is converted to a maleimide group by a reaction with maleic anhydride.

The above terminal amino group-containing polymer (hereinafter referred to simply as ED) and the above terminal maleimide group-containing polymer (hereinafter referred to simply as MA) were, respectively alone or in combination at a weight ratio of 1:1, dissolved in perfluorobutylamine alone, or in a solvent mixture of a fluorine-containing alcohol [2,2,3,3,3-pentafluoropropanol (hereinafter referred to simply as PFPA) or 3,3,4,4,5,5,6,6,7,7,8,8,8-tridecafluorooctanol (hereinafter referred to simply as TDOA)] and perfluorotributylamine (hereinafter referred as PFBA), at 55° C. The viscosity (as measured by an E-type viscometer) of the solution at 25° C. is shown in Table 1.

TABLE 1

| | Polymer composition and weight ratio | Polymer concentration | Solvent composition and weight ratio | Viscosity of the solution (at 25° C.) |
|---|---|---|---|---|
| Example 1 | MA = 100 | 4 wt % | PFBA/TDOA = 95/5 | 19 cps |
| Comparative Example 1 | MA = 100 | 4 wt % | PFBA = 100 | 19000 cps |
| Example 2 | ED = 100 | 12 wt % | PFBA/TDOA = 95/5 | 140 cps |
| Comparative Example 2 | ED = 100 | 12 wt % | PFBA = 100 | 320 cps |
| Example 3 | ED/MA = 50/50 | 15 wt % | PFBA/TDOA = 97.5/2.5 | 8500 cps |
| Example 4 | ED/MA = 50/50 | 15 wt % | PFBA/TDOA = 95/5 | 2400 cps |
| Example 5 | ED/MA = 50/50 | 15 wt % | PFBA/TDOA = 90/10 | 1200 cps |
| Example 6 | ED/MA = 50/50 | 12 wt % | PFBA/PFPA = 99/1 | 3000 cps |
| Example 7 | ED/MA = 50/50 | 6 wt % | PFBA/PFPA = 99/1 | 125 cps |
| Example 8 | ED/MA = 50/50 | 12 wt % | PFBA/PFPA = 98/2 | 560 cps |
| Example 9 | ED/MA = 50/50 | 12 wt % | PFBA/PFPA = 95/5 | 240 cps |
| Example 10 | ED/MA = 50/50 | 12 wt % | PFBA/PFPA = 90/10 | 190 cps |
| Comparative Example 3 | ED/MA = 50/50 | ≧6 wt % | PFBA = 100 | No fluidity |

Comparative Example 4

Copolymer M ($[\eta]$=0.24 dl/g) of perfluorobutenylvinyl ether with perfluoro-3,6-dioxa-4-methyl-7-octenonitrile ($CF_2$=$CFOCF_2CF(CF_3)OCF_2CN$) was prepared by radical copolymerization.

The perfluoro-3,6-dioxa-4-methyl-7-octenonitrile in the copolymer was determined by $^{19}$F-NMR and found to be 1.2 mol %. This polymer was dissolved in 1H,1H,1H,2H,2H-perfluorodecane (hereinafter referred to simply as PFD) so that the concentration would be 5 wt %, to obtain a copolymer M solution. To convert the cyano group to an amidine group (—C(=NH)$NH_2$), ammonia gas was blown into the solution for 10 minutes, whereby the solution immediately became highly viscous and gelled.

Example 11

The conversion to amidine was conducted in the same manner as in Comparative Example 4 except that 0.5 part by weight of PFPA was added to 100 parts by weight of the copolymer M solution, whereby no remarkable increase of the viscosity or gelletion was observed.

Example 12

Copolymer M of Comparative Example 4 was dissolved in a solvent mixture of PFBA/TDOA (weight ratio: 95/5) so that the concentration became 15 wt %. Then, ammonia gas was blown into the solution at room temperature to obtain a solution of the amidine-converted copolymer, the viscosity of which was 2500 cps (at 250° C.).

Example 13

The amidine-converted solution of Example 12 was spin-coated on a silicon wafer and heat-treated at 350° C. for one hour in a nitrogen atmosphere. By the infrared absorption spectrum (FT-IR), absorption of a triazine ring formed by a crosslinking reaction was confirmed at 1560 cm$^{-1}$. Further, a perforation with a diameter of 2 μm was formed by etching and again heat-treated at 350° C. for one hour, whereby no change in the shape of the perforation was observed. The same test was carried out by using PBVE ($[\eta]$=0.24 dl/g) having a COOH group, whereby it was observed that the perforation was destroyed by the heat treatment after etching.

Formulation Examples

Polymer Solution A

Two parts by weight of PBVE having a COOH group ($[\eta]$=0.24 dl/g) was dissolved in 98 parts by weight of perfluoro(2-butyltetrahydrofuran) (hereinafter referred to simply as PBTF) to obtain a solution having a polymer concentration of 2 wt %.

Polymer Solution B

Two parts by weight of PBVE having a $COOCH_3$ ($[\eta]$=0.24 dl/g) was dissolved in 98 parts by weight of PBTF to obtain a solution having a polymer concentration of 2 wt %.

Polymer Solution C

Nine parts by weight of PBVE having a COOH group ($[\eta]$=0.24 dl/g) was dissolved in 91 parts by weight of PFBA/TDOA (weight ratio: 92/5) to obtain a solution having a polymer concentration of 9 wt %.

Example 14

To 200 g of polymer solution A, 10.3 g of PFPA and 0.19 g of γ-aminopropylmethyldiethoxysilane were added and mixed to obtain a solution having a viscosity of 2.7 cps (at 25° C.). This polymer solution was maintained at 55° C. for 4 days, whereupon the viscosity was again measured at 25° C., whereby no change was observed in the viscosity.

Using this polymer solution, coating in a thickness of 0.1 μm on a glass substrate was carried out, whereby the reflectance was 0.9%. A tape-peel test was conducted by a crosscut tape method of JIS K5400. After repeating the peel test 10 times with an adhesive tape, all crosscut sections remained intact.

Comparative Example 5

To 200 g of polymer solution A, 0.23 g of γ-aminopropyltriethoxysilane was added to obtain a solution having a viscosity of 5.7 cps (at 25° C.). This polymer solution was maintained at 25° C. for 4 days, and the viscosity was again measured at 25° C., whereby the viscosity was found to have increased to 8.0 cps (at 25° C.).

Example 15

To 300 g of polymer solution A, 15.5 g of PFPA and 0.075 g of γ-glycidoxypropylmethyldiethoxysilane were added and mixed to obtain a colorless transparent solution having a viscosity of 3.3 cps (at 25° C.). By the crosscut tape peel test, the same results as in Example 14 were obtained. This solution was maintained at 55° C. for 2 days and then the viscosity was again measured, whereby no change was observed.

Example 16

The experiment was conducted in the same manner as in Example 15 except that the amount of γ-glycidoxypropylmethyldiethoxysilane was changed to 0.375 g. The liquid obtained by mixing, was transparent, and the viscosity was 3.3 cps (at 25° C.). By the crosscut tape peel test, the same results as in Example 14 were obtained. This solution was maintained at 55° C. for 2 days, and then the viscosity was again measured, whereby no change was observed.

Example 17

To 230 g of polymer solution C, 0.2 g of γ-aminopropylmethyldiethoxysilane was added to obtain a colorless transparent liquid. The viscosity of the solution was 400 cps (at 25° C.). After maintaining it at 55° C. for one day, the viscosity increased a little to give polymer solution D having 675 cps (at 25° C.). However, the viscosity of a transparent solution obtained by adding 0.6 g of γ-aminopropylmethyldiethoxysilane to the same amount of polymer solution C, was 290 cps, and it was polymer solution E which is free from an increase of the viscosity even after being maintained at 55° C. for one day.

Solutions D and E were spin-coated on silicon wafers and dried at 180° C. With respect to the obtained coating films, crosscut tape tests were conducted. In each case, no peeling of crosscut square sections was observed. Further, solutions D and E were likewise spin-coated on silicon wafers and dried at 250° C., and then cross-cutting lines were imparted thereto, followed by heat-treatment at 300° C. for one hour. A microscopic inspection was conducted, whereby no trace of melting of the resin was observed. Solutions D and E were cast and dried at 200° C. The obtained cast films maintained their shapes without being dissolved in the solvent for solution C.

Comparative Example 6

In polymer solution C, 1,3-dichloro-1,1,2,2,3-pentafluoropropane was used instead of TDOA to obtain a polymer solution. To 230 g of this polymer solution, 0.2 g of γ-aminopropylmethyldiethoxysilane was added to obtain a colorless transparent liquid. The viscosity of this solution was 350 cps (at 25° C.).

This solution was spin-coated on a silicon wafer and dried at 180° C. to obtain a coating film, but the surface of the coating film was found roughened like an orange peel surface, and a smooth coating film was not obtained.

Example 18

To 80 g of polymer solution A, 0.05 g of γ-glycidoxypropylmethyldiethoxysilane and 0.09 g of 3,3,4,4,5,5,6,6,7,7,8,8-tridecafluorooctylmethyldimethoxysilane were added. The viscosity of the obtained solution was 3.6 cps (at 25° C.). Using this solution, the coating test was conducted in the same manner as in Example 14 to obtain a transparent uniform coating film. With respect to the obtained coating film, a crosscut tape test was conducted, whereby good adhesion was observed. This solution was maintained at 55° C. for 3 days, whereby no change in the viscosity was observed.

Comparative Example 7

Nine parts by weight of PBVE having a COOH group ([η]=0.24 dl/g) was dissolved in 91 parts by weight of PBTF to obtain a solution having a polymer concentration of 9 wt %. To this solution, 0.45 g of aminophenyltrimethoxysilane was added, whereby the solution became turbid like milk. This polymer solution was spin-coated on a silicon wafer and dried at 180° C. to obtain a coating film. The film was non-uniform with surface roughness.

Example 19

To 230 g of polymer solution C, 0.67 g of aminophenyltrimethoxysilane was added to obtain colorless transparent polymer solution F. The viscosity of the solution was 290 cps (at 25° C.). No increase in the viscosity was observed even after it was maintained at 55° C. for one day.

Example 20

Polymer solutions E and F were, respectively, spin-coated on silicone wafers and dried at 180° C. Then, they were cured at 250° C. to form uniform coating films E and F. With respect to these coating films, crosscut tape tests were conducted, whereby no peeling of the coating films was observed, and excellent adhesion was shown. Further, such crosscut test pieces were subjected to a pressure cocker test (hereinafter referred to simply as PCT) (maintained for 15 hours in a high temperature high humidity chamber at 127° C. under a humidity of 100%), and again the tape peel tests were conducted, whereby no peeling of the crosscut sections were observed with both coating films E and F.

Then, the respective coating films were prepared by changing the curing temperature to 300° C. and 350° C., and the tape peel tests were conducted before and after PCT, and the results are shown in Table 2.

TABLE 2

| Polymer solution | Curing temp. | Crosscut peel test | |
|---|---|---|---|
| | | Initial | After PCT |
| E | 250 | 10 | 10 |
| E | 300 | 10 | 10 |
| E | 350 | 10 | 10 to 8 |
| F | 250 | 10 | 10 |
| F | 300 | 10 | 10 |
| F | 350 | 10 | 10 |

10: No peeling was observed with respect to all crosscut sections.
10 to 8: Slight peeling was observed.

Polymer Solution G

Nine parts by weight of a perfluoro-2,2-dimethyl-1,3-dioxolan/perfluorobutenylvinyl ether copolymer (Tg=160° C., [η]:0.43) was dissolved in 91 parts by weight of PFBA/TDOA (weight ratio: 92/8) to obtain a solution having a polymer concentration of 9 wt %.

Example 21

To 230 g of polymer solution G, 0.44 g of aminophenyltrimethoxysilane was added to obtain colorless transparent polymer solution H. The viscosity of the solution was 800 cps (at 25° C.). No increase in the viscosity was observed after it was maintained at 55° C. for one day.

Example 22

Polymer solution G was spin-coated on a silicon wafer and dried at 180° C. Then, it was cured at 250° C. to obtain a uniform coating film. With respect to this coating film, a crosscut tape peel test was conducted, whereby no peeling of the coating film was observed, and excellent adhesion was shown. Further, the crosscut test piece was subjected to PCT (maintained for 15 hours in a high temperature high humidity chamber at 127° C. under a humidity of 100%), and then the tape peel test was conducted again, whereby no peeling of the crosscut squares was observed.

Then, coating films were prepared by changing the curing temperature to 300° C. and 350° C., and the tape peel tests were conducted before and after PCT, and the results are shown in Table 3.

TABLE 3

| Polymer solution | Curing temp. | Crosscut peel test Initial | Crosscut peel test After PCT |
| --- | --- | --- | --- |
| G | 250 | 100 | 100 |
| G | 300 | 100 | 100 |
| G | 350 | 100 | 80 |

Formulation Example 20 g of spherical silica having an average particle diameter of 0.6 μm was introduced into 200 cc of distilled water and dispersed by a stirrer. 0.5 g of γ-aminopropylmethyldiethoxysilane was added thereto, and the mixture was stirred for 3 hours. This solution was thoroughly dried in a drier at 140° C. for 24 hours and at 180° C. for 3 hours. 10.5 g of the spherical silica after this treatment with a silane coupling agent, 7 g of polymer H, 93 g of PFBA, 0.42 g of γ-aminopropyltrimethoxysilane and 5 g of TDOA were mixed by a stirrer and then kneaded in an alumina ball mill for 24 hours to obtain resin composition H.

As a comparison, resin composition J was prepared in the same manner except that TDOA was not employed.

Example 23

Resin compositions H and J were stored at room temperature, and the viscosity changes were measured. As a result, as shown in Table 1, with the one having TDOA incorporated, no increase in the viscosity was observed, but the one having no TDOA incorporated, underwent gelletion upon expiration of 7 days.

Further, each of the resin compositions immediately after being formulated, was cast on 5 sets of glass plates and heat-dried at 80° C. for one hour, at 120° C. for one hour and at 170° C. for 2 hours, and coating films thereby obtained were visually inspected, whereby in the case of resin composition H, the surface of all coating films was flat. The coating films were partially peeled to measure the thickness, and in each case, the thickness was about 80 μm. Whereas, in the case of resin composition J, some coating films had irregularities on the surface, and some contained large bubbles.

TABLE 4

| | Viscosity cps (stored at room temp.) | | |
| --- | --- | --- | --- |
| | Initial | 1 day later | 7 days later |
| Resin composition H | 550 | 1000 | gelled |
| Resin composition J | 330 | 330 | 330 |

Example 24 and Comparative Example 8

With respect to resin composition H, (1) the water absorptivity, (2) the moisture permeability, (3) the adhesion and (4) the reliability after sealing an element, were tested. For (1) the water absorptivity, the resin composition was distilled at 180° C. for 12 hours to remove the solvent and to obtain a shaped product having a diameter of 50 mm and a thickness of 3 mm, which was then left to stand for 24 hours in saturated steam at 121° C. at 2 atm, and the water absorptivity was determined by the increased weight. For (2) the moisture permeability, the resin composition was distilled at 180° C. for 12 hours to remove the solvent, and the moisture permeability was measured in accordance with JIS Z0208. For (3) the adhesion, the resin composition was spin-coated on a silicon wafer, then cured at 180° C. for one hour and subjected to the PCT test (conditions: 121° C., 2 atm, 50 hours), whereby the adhesion was evaluated by a crosscut peel test (JIS K5400: ten points method, even number points). For (4) the reliability after sealing an element, the resin composition was coated by a dispenser on a model element having an aluminum wiring formed with a width of 3 μm and dried at 150° C. for one hour to distill off the solvent for sealing. Then, a PCT test (121° C., 2 atm) was carried out, whereupon the number of broken lines of the aluminum wiring by corrosion, was counted, and the time until the accumulated defect ratio became 50%, was measured. The results of the above tests are shown in Table 5 together with the results of a Comparative Example wherein a fluorine-containing polymer containing no filler was used for comparison.

TABLE 5

| Evaluated items (units) | Example 24 | Comparative Example 8 |
| --- | --- | --- |
| Water absorptivity (%) | 0.01> | 0.01> |
| Moisture permeability (g/m²/24 hr) | 18 | 25 |
| Adhesion | 8 | 2 |
| Reliability after sealing an element (hr) | 530 | 300 |

Example 25

One part of PBVE having a COOH group ([η]=0.24 dl/g) was dissolved in 10 parts of PBTF to obtain a polymer solution. Then, 0.02 part of 9-aminoacridine was added as a colorant to 2 parts of 2-(perfluorohexyl)ethanol to obtain a solution. To this solution, the polymer solution was mixed to obtain a uniform solution. The solution thus prepared was cast on a glass plate and dried at 100° C. to obtain a film having a thickness of 70 μm and having a yellow colorant uniformly dispersed. The ultraviolet and visible light absorption spectrum of this film was measured, whereby it was found that lights of 500 nm or higher passed at least 90%, while ultraviolet lights of 260 nm or lower were absorbed 100%.

Example 26

A film was prepared in the same manner as in Example 25 except that 0.01 part of 2-aminobenzothiazole was used as the colorant. Absorption by the colorant was observed at 350 nm or lower, and visible lights of 400 nm or higher had a permeation of at least 85%, whereby it was confirmed that the colorant was uniformly dispersed.

Example 27

Preparation of a Fluorine-Containing Polymer Solution Having Colloidal Silica Dispersed Therein To organo silica sol OSCAL1432 (silica concentration: 30.7 wt %), manufactured by Shokubai Kasei Kogyo, having fine particles of silica with a particle size of from 10 to 20 nm dispersed in isopropyl alcohol (hereinafter referred to simply as IPA), 40 parts by weight of a fluorine-containing surface treating agent $(F(CF_2)_6(CH_2)_2Si(OCH_3)_3)$ was added per 100 parts by weight of silica. Further, a 1 wt % acetic acid aqueous solution was added thereto so that water was added in an equimolar amount of the alkoxy group of this fluorine-containing surface treating agent, and the mixture was refluxed for one hour, to obtain an organo silica sol treated with a fluorine-containing treating agent (hereinafter referred to simply as solution A).

Then, solution A was added so that silica would be 2.14 parts by weight per 100 parts by weight of a mixed solution of PFPA and PFD (weight ratio: 1/9). The solvent was distilled off under heating until the boiling point became stabilized at the boiling point of PFD, to obtain a milky white organosol containing no IPA and PFPA.

Then, PFD was added thereto to the total amount of 92.3 parts by weight, and 7.7 parts by weight of PBVE having a COOH group ($[\eta]$:0.24 dl/g) (hereinafter referred to simply as a fluorine-containing polymer) was dissolved therein to obtain a bluish white translucent stable fluorine-containing polymer-containing organo silica sol (hereinafter referred to simply as solution B) having a fluorine-containing polymer concentration of 7.7 wt % and a ratio of this fluorine-containing polymer, silica and the fluorine-containing surface treating agent of 72:20:8.

Example 28

To 30 g of solution B, 0.11 g of γ-aminopropylmethyldiethoxysilane was added (hereinafter referred to as solution C). To 6.65 g of this solution C, 0.35 g of 2-(perfluorohexyl)ethanol (hereinafter referred to simply as PFHE) was added. The viscosity of the solution (at 25° C., E model viscometer) was 1265 cps. This solution was spin-coated on a silicon wafer and dried at 250° C. for one hour. The thickness of the coating film was 2.4 μm.

With respect to the obtained coating film, a tape peel test was conducted by the crosscut tape method of JIS 5400, whereby no abnormality was observed in the crosscut sections. To test the anti-melting fluidity, solution C was spin-coated in the same manner and dried at 250° C. for one hour, and then crosscut lines were imparted, followed by heat treatment at 300° C. for one hour. A microscopic inspection was conducted, whereby no trace of melting of the resin was observed. Solution C was cast and dried at 200° C. To test the solubility resistance, the obtained cast film was immersed in the solvent for solution C at 60° C. for one week, whereby the film did not dissolve and maintained its shape.

Example 29

In the same manner as for solution B, a solution having a fluorine-containing polymer concentration of 8.5 wt % with a ratio of the fluorine-containing polymer, silica and the fluorine-containing surface treating agent of 58:30:12, was prepared. To 30 g of this solution, 0.12 g of γ-aminopropylmethyldiethoxysilane was added, and the mixture was cast on a glass plate and dried at 50° C. for one hour, at 100° C. for one hour and then at 180° C. for one hour. The thickness of the coating film was 10 μm, and the pencil hardness was 2H.

Comparative Example 9

From a fluorine-containing polymer solution comprising the fluorine-containing polymer and solvent PFD, a coating film having a thickness of 10 μm was obtained under the same conditions as in Example 29. The pencil hardness of this cast film was 2B.

Example 30

A solution having the same composition as solution B was prepared except that the solvent was not PFD but was a solvent mixture of PFBA/PFHE (weight ratio: 95/5). To 30 g of this solution, 0.11 g of γ-aminopropylmethyldiethoxysilane was added, and the same test as in Example 28 was conducted. In each of the tape peel test, the anti-melting fluidity and the antisolubility, the same results as in Example 28 were obtained.

What is claimed is:

1. A fluorine-containing polymer composition comprising a polymer having a functional group and a fluorine-containing aliphatic cyclic structure dissolved in a solvent mixture of an aprotic fluorine-containing solvent and a protic fluorine-containing solvent.

2. The composition according to claim 1, wherein the aprotic fluorine-containing solvent is a fluorine-containing aliphatic hydrocarbon, a fluorine-containing aromatic hydrocarbon, a fluorine-containing alicyclic hydrocarbon, a fluorine-containing alkylamine, a fluorine-containing cyclic ether, a fluorine-containing polyether or a fluorine-containing ketone.

3. The composition according to claim 1, wherein the protic fluorine-containing solvent is a fluorine-containing alcohol, a fluorine-containing carboxylic acid or a fluorine-containing sulfonic acid.

4. The composition according to claim 1, wherein the solvent mixture contains at least one member selected from the group consisting of a silane coupling agent, an inorganic filler and a colorant.

5. The composition according to claim 4, wherein the silane coupling agent is an aromatic amine-type silane coupling agent.

6. The composition according to claim 4, wherein the inorganic filler is a metal oxide.

7. An article having a coating film of the composition as defined in claim 1.

8. The article according to claim 7, wherein the coating film is a sealing film for a semiconductor part, a buffer coating film for a semiconductor part, a passivation film for a semiconductor part, an interlaminar insulating film for a semiconductor part, an anti-reflection film, a pellicle or an interlaminar insulating film for a multilayer circuit board.

9. A sealing or adhesive resin composition made of the composition as defined in claim 1 which contains a silane coupling agent or an inorganic filler.

10. The composition according to claim 1, wherein the functional group is a group comprising at least two atoms, said functional groups having an affinity to each other, as components of said polymer, which is greater than their affinity to the aprotic solvent component of the solvent combination.

11. The composition according to claim 1, wherein the cyclic structure within said polymer forms during polymerization of the monomer components of the polymer which monomer components comprise perfluoro(alkylvinyl ether) or perfluoro(butenylvinyl ether).

12. The composition according to claim 1, wherein the cyclic group containing polymer is a homopolymer or copolymer of perfluoro(2,2-dimethyl-1,3-dioxole).

13. The composition according to claim 1, wherein said polymer, as a copolymer, contains units of tetrafluoroethylene, perfluoroalkylvinyl ether, vinylidine fluoride, vinyl fluoride or chlorotrifluoroethylene.

14. The composition of according to claim 1, wherein the polymer contains a coupling group of the formula: $MR^1_{n-a}R^2_a$, wherein M is a member selected from the group consisting of Si, Ti, Zr, Hf, Th and Al, $R^1$ is halogen, hydroxyl, amino or $-OR^3$, wherein $R^3$ is a monovalent organic group, $R^2$ is a monovalent organic group, and n is 2 or 3 and a is 0, 1 or 2, provided that when n is 2, a is 0 or 1.

* * * * *